United States Patent
Stenestam

(10) Patent No.: US 9,128,477 B2
(45) Date of Patent: Sep. 8, 2015

(54) BUSHING DIAGNOSIS

(75) Inventor: Bengt-Olof Stenestam, Ludvika (SE)

(73) Assignee: ABB TECHNOLOGY LTD. (CH)

( * ) Notice: Subject to any disclaimer, the term of this patent is extended or adjusted under 35 U.S.C. 154(b) by 875 days.

(21) Appl. No.: 13/154,029

(22) Filed: Jun. 6, 2011

(65) Prior Publication Data

US 2011/0301880 A1 Dec. 8, 2011

Related U.S. Application Data

(63) Continuation of application No. PCT/EP2009/064208, filed on Oct. 28, 2009.

(30) Foreign Application Priority Data

Dec. 5, 2008 (EP) .................................. 08170770

(51) Int. Cl.
   *G01R 31/00* (2006.01)
   *G05B 19/042* (2006.01)
   *G01R 31/02* (2006.01)

(52) U.S. Cl.
   CPC .......... *G05B 19/0428* (2013.01); *G01R 31/027* (2013.01); *G05B 2219/24042* (2013.01)

(58) Field of Classification Search
   CPC .......................... G05B 19/0428; G01R 31/027
   USPC .......................................................... 702/50
   See application file for complete search history.

(56) References Cited

U.S. PATENT DOCUMENTS

| 4,019,007 | A | * | 4/1977 | Friedrich et al. ................. 218/79 |
| 4,654,806 | A | | 3/1987 | Poyser et al. |
| 5,657,510 | A | | 8/1997 | Satori et al. |
| 5,736,915 | A | * | 4/1998 | Goedde et al. .................. 336/55 |
| 5,900,538 | A | * | 5/1999 | Bastian .......................... 73/49.2 |
| 2002/0161558 | A1 | | 10/2002 | Georges et al. |
| 2003/0112569 | A1 | * | 6/2003 | Kato et al. ..................... 361/93.1 |
| 2004/0021449 | A1 | * | 2/2004 | Stenestam et al. ............. 323/255 |
| 2005/0223782 | A1 | | 10/2005 | Dohi et al. |

FOREIGN PATENT DOCUMENTS

| EP | 0747715 A2 | 12/1996 |
| JP | 06162848 A * | 6/1994 |

OTHER PUBLICATIONS

Tenbohlen et al., Benefit of Sensors for on-line monitoring systems for power transformers, http://www.uni-stuttgart.de/ieh/forschung/veroeffentlichungen/2003_Matpost_Tenbohlen.PDF, posted online Oct. 24, 2004.*

(Continued)

*Primary Examiner* — Timothy H Hwang
(74) *Attorney, Agent, or Firm* — St. Onge Steward Johnston & Reens LLC

(57) ABSTRACT

A method and a device for diagnosing the status of an electrical apparatus having a sealed fluid based insulating system. The device includes at least one input for receiving measurements of a current running through the apparatus and measurements of an actual apparatus fluid pressure as well as a diagnosing unit. The diagnosing unit determines a corresponding theoretical apparatus fluid pressure based on the measured current, compares the actual apparatus fluid pressure with the theoretical apparatus fluid pressure and diagnoses the status of the apparatus based on the comparison.

18 Claims, 3 Drawing Sheets

(56) References Cited

OTHER PUBLICATIONS

European Search Report; Application No. EP 08 17 0770; Issued: Jun. 15, 2009; 4 pages.
Hamel, et al.; "Estimating Overpressures in Pole-Type Distribution Transformers Part I: Tank Withstand Evaluation"; IEEE Transactions on Power Delivery, vol. 18, No. 1; Jan. 2003; pp. 113-119.
International Search Report and Written Opinion of the International Searching Authority; Application No. PCT/EP2009/064208; Issued: Dec. 1, 2009; 10 pages.
Allan, et al; "New Insulation Diagnostic and Monitoring Techniques for In-Service HV Apparatus"; Proceedings of the 3rd International Conference on Properties and Applications of Dielectric Materials; Jul. 8-12, 1991, pp. 448-451.

* cited by examiner

BUSHING DIAGNOSIS

CROSS-REFERENCE TO RELATED APPLICATIONS

The present application is a continuation of pending International patent application PCT/EP2009/064208 filed on Oct. 28, 2009 which designates the United States and claims priority from European patent application 08170770.5 filed on Dec. 5, 2008, the content of which is incorporated herein by reference.

FIELD OF THE INVENTION

The present invention relates to electrical apparatuses having sealed fluid based insulating systems, such as bushings for pieces of electrical high-voltage equipment, and more particularly to a method, device and computer program product for diagnosing the status of an electrical apparatus having a sealed fluid based insulating system.

BACKGROUND OF THE INVENTION

One type of electrical apparatus that has a sealed fluid based insulating system is an electrical property measuring and field controlling apparatus, which may be a bushing. Bushings may be provided for pieces of electrical high-voltage equipment and are known to carry current of high voltage through a zone of a different potential, which different potential is ground potential when the bushing is a transformer bushing. In order to avoid being a safety hazard, the bushing itself needs to be monitored regarding how well it is functioning.

One way to perform this may be through opening the bushing and take samples of the fluid, for instance oil, which is used as an insulating medium inside the bushing. The temperature of this oil can then be measured and used for diagnosing the bushing. However, when this is done the properties of the bushing are altered. The amount of oil in the bushing may be changed and the oil may also become contaminated when opening the bushing. There is in this case also a risk that the bushing is not sealed properly after such taking of samples.

There is therefore a need for an alternative way of diagnosing a bushing.

There are in the art some documents describing diagnosing of transformers.

US 2005/0223782 does for instance describe a transformer monitoring system. Here the current of the transformer and an ambient temperature are measured. These are used for determining an oil temperature of the transformer. The actual transformer oil temperature is then measured and compared with the determined oil temperature and an anomaly is determined if a temperature difference exceeds a threshold. Also the inner pressure of the transformer is determined and compared with a threshold and an anomaly is determined if this pressure exceeds a pressure threshold.

US 2002/0161558 describes a transformer monitoring system. In the system a number of physical quantities are monitored, like current, top oil temperature and ambient temperature.

U.S. Pat. No. 4,654,806 describes a transformer monitoring system. In this system various parameters are measured, such as oil temperature, ambient temperature and pressure. These are then each compared with a corresponding threshold.

All of these documents use monitoring of a transformer top oil temperature.

There do also exist some documents related to diagnosing bushings.

EP 747 715 does for instance describe diagnosing the status of a bushing through measuring imbalance current waveforms from a number of bushings, comparing imbalance values with each other and initial values to determine if a threshold is exceeded. If the threshold is exceeded there is a determination being made about which of the bushings that have changed as well as the changes in capacitances and power values of these bushings. These changed capacitances and power values are then temperature compensated based on (transformer) top-oil and ambient temperatures. This document seems to require several bushings for performing diagnosing and furthermore only measures the current.

The article "New Insulation Diagnostic and Monitoring Techniques for In-Service HV Apparatus" BY D. M. Allan, M. S. Blundell, K. J. Boyd and D. D. Hinde, Proceedings of the 3$^{rd}$ International Conference on Properties and Applications of Dielectric Materials, Jul. 8-12, 1991, Tokyo, Japan describes a monitoring system for a transformer as well as for a transformer bushing through monitoring DDF (Dielectric Dissipation Factor).

There is thus a need for diagnosing an electrical apparatus having a sealed fluid based insulating system that can be used without opening the electrical apparatus and taking samples and that may be applied for one single electrical apparatus.

SUMMARY OF THE INVENTION

The present invention is directed towards solving the problem of providing diagnosis that can be performed for a single electrical apparatus having a sealed fluid based insulating system without having to open this electrical apparatus.

This problem is generally solved through determining a theoretical apparatus fluid pressure based on received measurements of a current running through the apparatus, comparing received measurements of an actual apparatus fluid pressure with the theoretical apparatus fluid pressure and diagnosing the status of the apparatus based on the comparison.

One object of the present invention is thus to provide a method for diagnosing the status of an electrical apparatus having a sealed fluid based insulating system, which can be performed for a single apparatus without having to open this electrical apparatus.

This object is according to the present invention solved through a method for diagnosing the status of an electrical apparatus having a sealed fluid based insulating system and comprising the steps of:

receiving measurements of a current running through the apparatus, determining a theoretical apparatus fluid pressure based on the measured current, receiving measurements of a corresponding actual apparatus fluid pressure, comparing the actual apparatus fluid pressure with the theoretical apparatus fluid pressure, and diagnosing the status of the apparatus based on the comparison.

Another object of the present invention is to provide a device for diagnosing the status of an electrical apparatus having a sealed fluid based insulating system, which can perform diagnosis for a single electrical apparatus without having to open this electrical apparatus.

This object is according to another aspect of the present invention solved through a device for diagnosing the status of an electrical apparatus having a sealed fluid based insulating system comprising:
at least one input for receiving measurements of a current running through the apparatus and measurements of an actual apparatus fluid pressure, and
a diagnosing unit having
means for determining a corresponding theoretical apparatus fluid pressure based on the measured current,
means for comparing the actual apparatus fluid pressure with the theoretical apparatus fluid pressure, and
means for diagnosing the status of the apparatus based on the comparison.

A further object of the present invention is to provide a computer program product for diagnosing the status of an electrical apparatus having a sealed fluid based insulating system, which allows the diagnosis to be performed for a single electrical apparatus without having to open this electrical apparatus.

This object is according to a further aspect of the present invention solved through a computer program product for diagnosing the status of an electrical apparatus having a sealed fluid based insulating system comprising:
computer program code provided on a data carrier for making a computer perform the following steps, when said computer program code is loaded in the computer
determine a corresponding theoretical apparatus fluid pressure based on received measurements of a current running through the apparatus,
receive measurements of an actual apparatus fluid pressure,
compare the actual apparatus fluid pressure with the theoretical apparatus fluid pressure, and
diagnose the status of the apparatus based on the comparison.

The present invention has a number of advantages. It allows diagnosing the status of a single electrical apparatus having a sealed fluid based insulating system without the electrical apparatus having to be opened for investigating the content of it. Such opening may negatively influence the comparison in that properties of insulating mediums used in the electrical apparatus may be changed, which may have a negative effect on the safety of the electrical apparatus. Also pollution and/or contaminants can enter the electrical apparatus. An opening may also lead to a re-closing not being performed properly. The electrical apparatus may become leaky. All these problems are avoided with the diagnosing of the present invention. The diagnosing can furthermore be performed in a very simple way with a limited number of further elements in addition to those that are normally used when diagnosing electrical apparatus and pieces of electrical high-voltage equipment, such as bushings and transformers.

Further objectives and advantages, as well as the structure and function of an exemplary embodiment will become apparent from a consideration of the description and drawings.

BRIEF DESCRIPTION OF THE DRAWINGS

The foregoing and other features and advantages of the invention will be apparent from the following, more particular description of an exemplary embodiment of the invention, as illustrated in the accompanying drawings wherein like reference numbers generally indicate identical, functionally similar, and/or structurally similar elements.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

Electrical apparatuses having sealed fluid based insulating systems are known to be used in relation to high-voltage applications. A bushing is one such apparatus that is used for measuring electrical properties of pieces electrical high-voltage equipment, which pieces of equipment may be conductors, power lines and inductively operating elements such as transformers and reactors.

In order to provide correct measurement results, which are vital for the control and safety in high-voltage applications, there is a need for the electrical apparatus to function properly. The functioning of it does therefore have to be diagnosed. The present invention is directed towards providing such diagnosis. This type of diagnosis is provided for determining if the electrical apparatus is functioning properly or not and to determine in what way it is faulty if not functioning properly.

Figure 1:
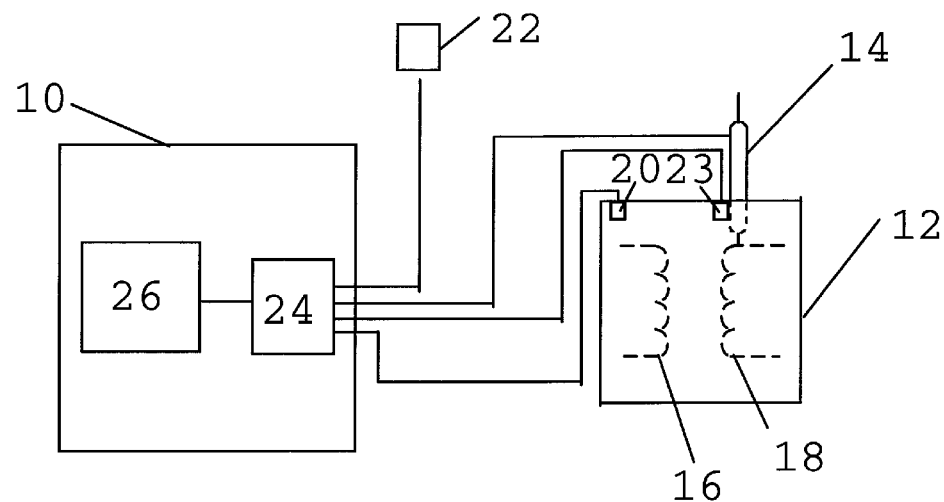
FIG. 1 shows a schematic view of a device according to the present invention being connected to a bushing as well as to temperature sensors, where the bushing is in turn attached to a transformer.

FIG. 1 schematically shows a device 10 for diagnosing the functioning of an electrical apparatus having a sealed fluid based insulating system. This electrical apparatus is here a bushing 14. The device 10 includes at least one input and here only one input 24, which is connected to two surrounding temperature sensors, an ambient temperature sensor 22 and an insulating medium temperature sensor of a piece of electrical high-voltage equipment that the bushing is attached to. In the embodiment of the invention depicted in FIG. 1, the piece of equipment is a transformer 12 provided in a transformer tank and the insulating medium is transformer oil in this tank. This transformer 12 has a first and a second winding 16 and 18. The insulating medium temperature sensor is therefore here a top oil temperature sensor 20. The input 24 is also connected to a current sensor 23 for detecting the current running through the bushing 14. It also has one connection to the bushing 14 for receiving apparatus fluid pressure measurements. As an alternative to using one input for several types of measurements, it is of course possible to use several inputs for the various measurements. The bushing 14 is attached to the transformer 12 and more particularly to the second winding 18 of the transformer 12. In the figure there is no bushing connected to the first winding 16. It should be realized that it is of course possible that a bushing is connected also to this first winding 16 either instead of or in addition to the bushing 14 being connected to the second winding 18. The input 24 is finally connected to a diagnosing unit 26 provided in the interior of the device 10, which unit 26 is configured to perform diagnosis of the electrical apparatus, i.e. to diagnose the health and functioning of the bushing. It should here be realized that the sensors may also include or be connected to A/D converters for providing digitalized measurements to the device 10.

Figure 2:
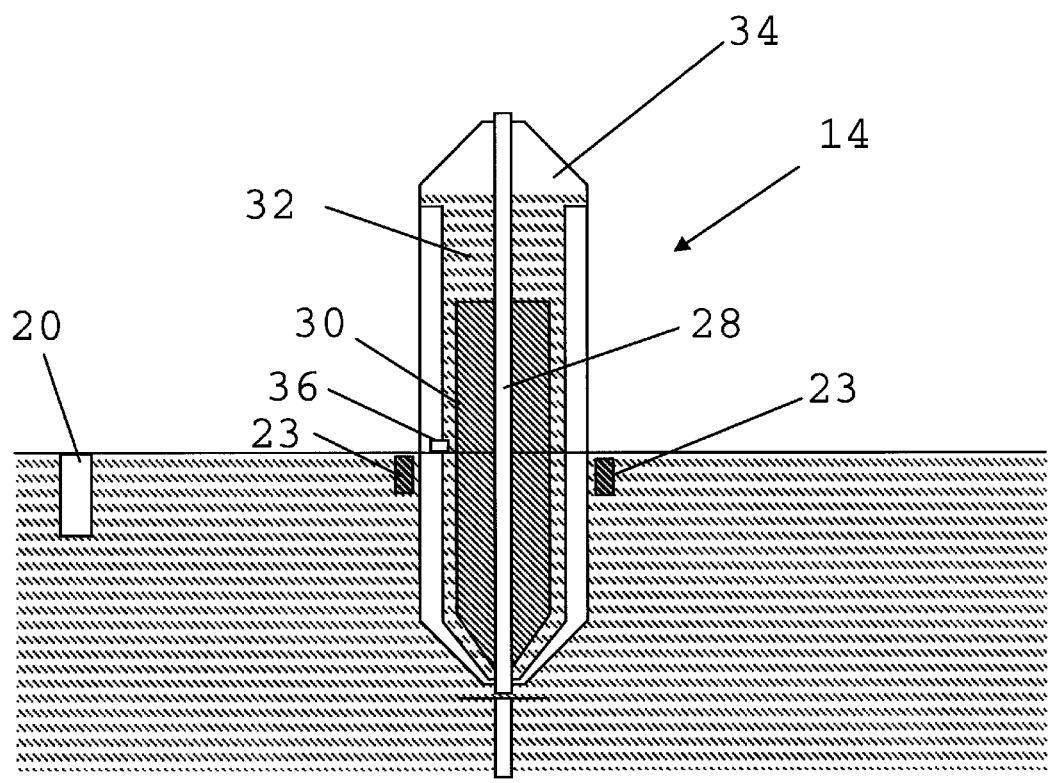
FIG. 2 shows a sectional view of the bushing.

A sectional view of one bushing 14 being provided in the transformer at a distance from the top oil sensor 20 and that can be used with the present invention is schematically shown in FIG. 2. As the bushing 14 is attached to the transformer a part of it is surrounded by the transformer oil of the transformer. The temperature of this transformer oil is determined by the top oil temperature sensor 20, which is placed in the transformer tank. The bushing 14 here includes a sealed chamber. The chamber has an extension in a direction, which direction is vertical when the bushing is attached to the transformer. In this chamber there runs a central electrical conductor 28 along this vertical direction, which conductor 28 is provided for connection to the transformer. The conductor 28 thus extends out of two opposite vertical ends of the chamber for being connected to the transformer at one end and may at the other end be connected to a line or to another electrical apparatus, where the end that is to be connected to the transformer is the lower vertical end. In a lower region of the chamber there is also provided insulation 30 or a condenser core surrounding the conductor 28, which lower region is the part of the chamber that faces the transformer. The insulation 30 is typically made of paper and has a voltage control normally provided by foils that encircle the conductor 28 in this lower region. The paper may be cellulose or synthetic. There is furthermore provided a first fluid insulating medium in the chamber. The first fluid insulating medium is here furthermore a liquid insulating medium 32, which liquid insulating medium is here transformer oil, which may be a vegetable oil. This first insulating medium 32 is here filled in the chamber to a level so that all the insulation 30 is covered, i.e. the insulation 30 is here soaked in the first insulating medium 32. Above the first insulating medium 32 there is here a second fluid insulating medium 34, which is here a gas, typically air. It may be another gas though, such as nitrogen. The second insulating medium 34 may here be provided at an overpressure. The second insulating medium 34 here provides a compressible volume for taking up volume variations of the liquid first insulating medium 32. The volume occupied by the second gaseous insulating medium 34 is therefore normally much smaller than the volume occupied by the first insulating medium 32. The second gaseous insulating medium 34 is for this reason also denoted a gas cushion. The first liquid insulating medium 32 is furthermore degassed. The first insulating medium is thus saturated and in a steady state. There is here furthermore provided a pressure sensor 36 in the wall of the chamber and in contact with the first insulating medium. With this placing the sensor will be provided at a low electric potential. The current sensor 23 may include a current transformer that is provided in the transformer tank and encircling the bushing 14. This current transfer is then magnetically connected to the conductor 28. These two latter sensors are furthermore connected to the input of the diagnosing device in FIG. 1. Naturally there may also here be provided A/D converters for converting analog measurement values into digital format.

Figure 3:
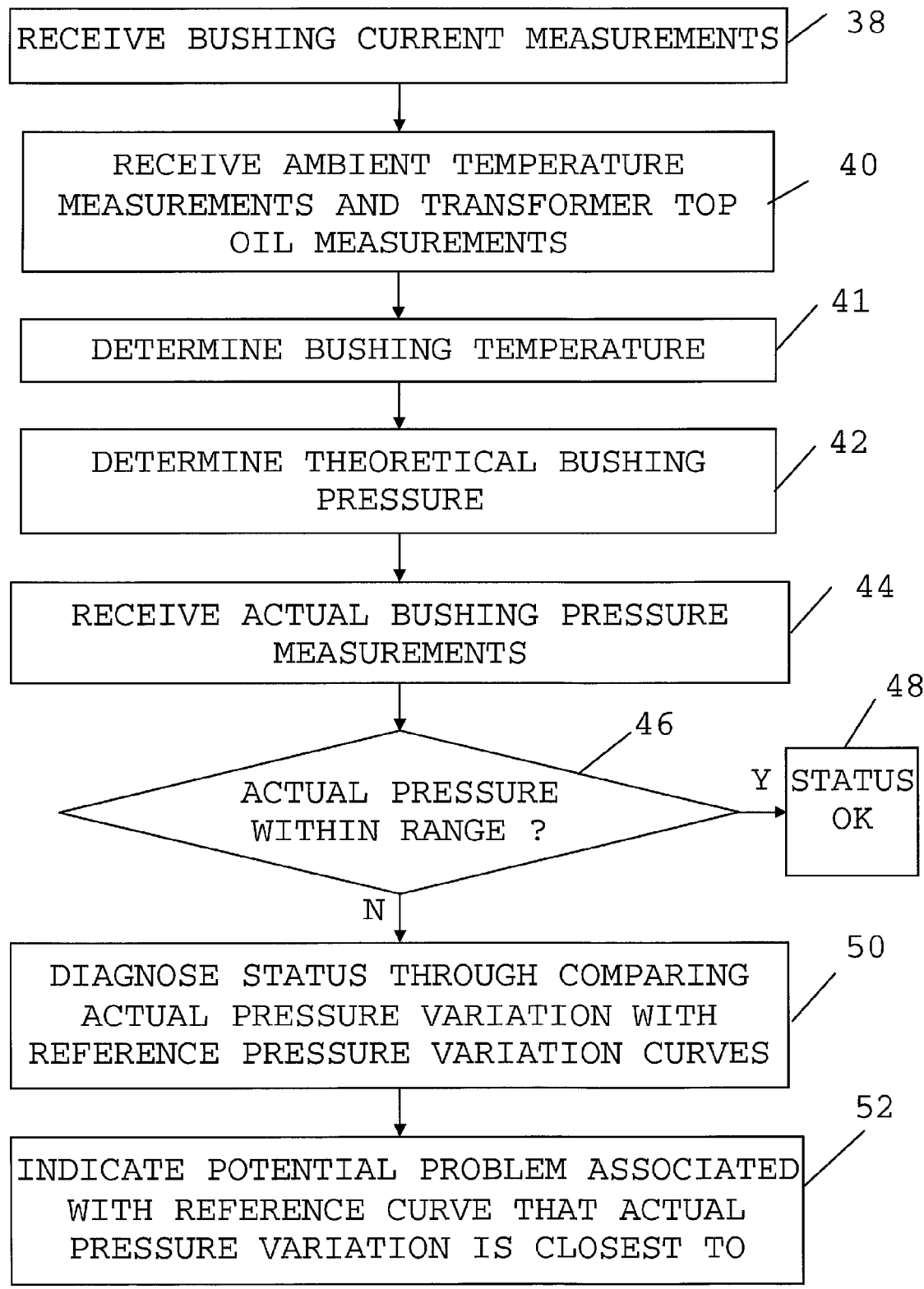
FIG. 3 shows a flow chart of a number of method steps being performed in a method for diagnosing the status of a bushing.

The functioning of the device will now be described with reference also being made to FIG. 3, which shows a flow chart of a number of method steps being performed in a method for diagnosing the status of a transformer bushing as shown in FIGS. 1 and 2.

The method starts with measuring the current in the conductor 28 of the bushing 14. These measurements are supplied from the bushing 14 to the input 24 of the diagnosing device 10, from where they are forwarded to the diagnosing unit 26. In this way the diagnosing unit 26 receives measurements of the current running through the bushing, step 38. In the same manner the ambient temperature sensor 22 senses the ambient temperature, i.e. the temperature in the area surrounding the transformer 12 and bushing 14, and forwards ambient temperature measurements to the input 24 of the diagnosing device 10, from where they are forwarded to the diagnosing unit 26. Ambient temperature may for instance be room temperature of about 20° C. Also the transformer top oil temperature sensor 20 senses the top oil temperature of the oil, i.e. the temperature of the insulating medium of the transformer 12, and forwards top oil temperature measurements to the input 24 of the diagnosing device 10, from where they are forwarded to the diagnosing unit 26. In this way the diagnosing unit 26 also receives ambient temperature measurements and transformer top oil measurements, step 40. Based on this data, the diagnosing unit 26 then determines a theoretical bushing pressure, which is a theoretical fluid pressure.

The theoretical bushing pressure is determined based on the current in the conductor 28. The amount and variation of the current over time in the conductor 28 gives rise to heat, which is transferred to the insulation 30 and first insulating medium 32. The heat transfer is dependent on known properties of the insulation 30 and the first insulating medium 32. Based on this heat transfer, the ambient temperature and the top oil temperature of the transformer 12 it is then possible to determine the temperature of the first insulating medium 32, which temperature is considered to be the bushing temperature. The bushing temperature is thus determined based on a determination of the heat generated in the bushing by the current, step 41, and the heat transferred to the surrounding media. This change in temperature is furthermore normally a slow process. This temperature furthermore gives rise to an expansion of this first insulating medium 32, which leads to the volume in the chamber being occupied by the first insulating medium increasing. Since the chamber is sealed, this expansion also leads to the volume of the second insulating medium decreasing. Also the temperature of the second insulating medium 34 or the gas cushion is here determined. This temperature depends on the previously determined bushing temperature, the ambient temperature and the current running through the conductor. Based on the gas cushion temperature and volume it is then possible to determine the pressure of the gas cushion. This pressure is then combined with the pressure of the first insulating medium in order to obtain a theoretical bushing pressure. In this way the diagnosing unit 26 thus determines a theoretical fluid pressure of the bushing, step 42. It is thus clear that the theoretical fluid pressure has a dependence of the bushing temperature.

As is clear from the foregoing description, the theoretical fluid pressure may be determined based on a model of the change in pressure in the gas cushion and through that the bushing pressure in relation to bushing temperature. In the present embodiment this change in pressure is determined based on the change in volume of the first insulating medium, which change in volume indirectly influences the theoretical fluid pressure, since it causes a change in volume of the second insulating medium, which then influences the theoretical fluid pressure.

Under the assumption that the gaseous second insulating medium in the gas cushion does not enter into the fluid insulating medium, the relationships described above may be expressed through the following equations:

The relationship between pressure, volume and temperature (expressed in Celsius) for the gas cushion can here be expressed as:

$$(P_{ci} * V_{ci})/(T_i+273) = (P_c * V_c)/(T_c+273) \quad (1)$$

where $P_{ci}$ is the initial pressure of the gas cushion, $V_{ci}$ is its initial volume and $T_i$ its initial temperature, i.e. before the transformer is put into operation, while $P_C$, $V_C$ and $T_C$ are the corresponding entities with the transformer put in operation.

The gas cushion volume with the transformer put into operation can further be expressed as:

$$V_c = V_{ci} + V_{xi} - V_x \quad (2)$$

here $V_{xi}$ is the initial first insulating medium volume and $V_x$ the first insulating medium volume after the transformer has been put into operation.

The mass m of the first insulating medium is $$m = V_x * \rho_x = V_x * (\rho_a + \rho_b * T_x) \quad (3)$$

where $\rho_x$ is the density of this medium. This density has a constant component $\rho_a$ and a temperature dependent component $\rho_b$, while $T_x$ is the average first insulating temperature in the bushing. This temperature $T_x$ is calculated from the heat transfer to the surrounding media and the heat generated in the bushing due to thermal and dielectric losses.

The temperature of the gas cushion can also be expressed as:

$$T_C = a*(T_{air}+273) + (a-1)*(T_x+273) \quad (4)$$

where a is a constant and $T_{air}$ is the ambient temperature.

With these equations it is possible to obtain an equation that determines the pressure of the gas cushion as:

$$P_c = \frac{(P_{ci} * V_{ci})[a*(T_{air}+273) + (a-1)*(T_x+273)]}{(T_i+273)[(V_{ci}+V_{xi})*(\rho_a+\rho_b*T_x) - m]} (\rho_a + \rho_b * T_x) \quad (5)$$

This theoretical fluid pressure can then be adjusted according to:

$$P_S = P_C + P_L \quad (6)$$

where $P_S$ is a corresponding theoretical fluid pressure at the pressure sensor 36 and $P_L$ is the pressure of the first liquid insulating medium column above the pressure sensor.

This was one example of how the theoretical fluid pressure can be determined. At the same time as such a determination is made, the pressure sensor 36 detects the actual fluid pressure in the bushing 14. The actual fluid pressure is thus detected simultaneously with the measuring of the abovementioned current. Measurements of the actual fluid pressure are supplied from the pressure sensor 36 to the input 24 of the diagnosing device 10, from which input they are then forwarded to the diagnosing unit 26. In this way the diagnosing unit 26 thus receives measurements of the corresponding actual fluid pressure in the bushing, step 44. The detected actual fluid pressure thus corresponds to the determined theoretical fluid pressure and vice versa. The pressure measurements are furthermore correlated with the current measurements. Because of this it is possible to associate a determined theoretical fluid pressure with a measured fluid pressure and optionally also with a certain bushing temperature. The diagnosing unit 26 then compares the corresponding detected and the theoretical fluid pressures with each other and if the difference between these is within a predetermined range, step 46, which range can vary depending on the determined bushing temperature, the diagnosing unit diagnoses or determines that the bushing is functioning satisfactorily, i.e. that the status of the bushing 14 is ok, step 48.

If however the status is outside of this range, step 46, the diagnosing unit 26 diagnoses that the bushing has changed its original properties or is faulty. In some variations of the present invention, this may be all that is done in the diagnosing of the bushing. The diagnosing may thus only involve separating a faulty from a functioning bushing based on the comparison of actual and theoretical fluid pressures. In a preferred embodiment of the present invention, the diagnosing unit 26 however continues when having determined that a bushing has changed its original properties or is faulty and further diagnoses the status of the bushing based on comparing the way the actual fluid pressure varies with bushing temperature with the way a set of reference pressure curves vary with temperature, step 50.

Figure 4:
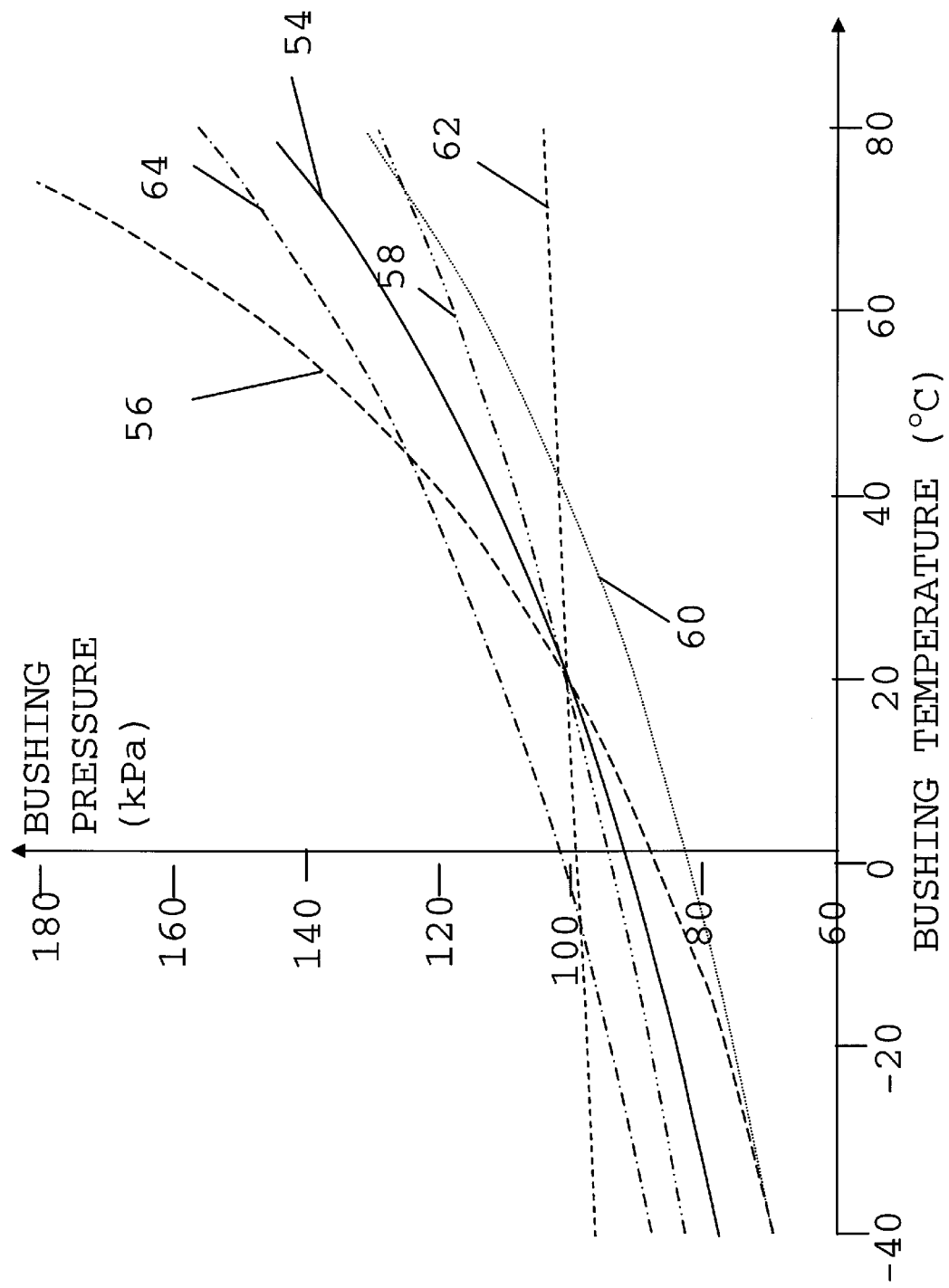
FIG. 4 shows a diagram with curves regarding pressure in relation to temperature and including a first curve representing a theoretical fluid pressure and a set of reference curves representing potential problems for the bushing.

How this may be done is now described with reference also being made to FIG. 4, which shows a diagram of pressure in relation to temperature including a first curve 54 representing the theoretical fluid pressure and a set of reference curves 56-64 representing various potential problems for the bushing. In the diagram the X-axis shows the temperature in ° C. and the Y-axis shows the pressure in kPa. These exemplifying curves are furthermore provided for a first insulating medium volume of 100 dm³ and a second insulating medium volume of 15 dm³ at room temperature. The curves, except for one potential problem curve, furthermore here represent a simplified situation where the second insulating medium has not started to enter or be solved in or mixed with the first insulating medium. There is here a curve 54 (shown as a solid line) of the theoretical fluid pressure or how the pressure should vary in relation to temperature when the bushing is functioning normally. This curve thus represents a bushing that functions satisfactory. There is also a first potential problem curve 56 (shown as a first dashed line) of how the pressure varies with temperature for a bushing including too much insulating medium, i.e. too much transformer oil. There is here a second potential problem curve 58 (shown as a first dash-dotted line) for a bushing including too little insulating medium, i.e. too little transformer oil. In the drawing there is a third potential problem curve 60 (shown as a dotted line), which shows how the pressure varies with temperature for a bushing where an oil sample has been taken at high temperature. There is also a fourth potential problem curve 62 (shown as a second dashed line) showing how the pressure varies with temperature for a leaking bushing, i.e. a bushing which is not completely tight. There is finally a fifth potential problem curve 64 (shown as a second dash-dotted line) showing how the bushing pressure varies with temperature for a bushing where gas has been formed in the oil or where there has been overheating. This last potential problem curve does therefore represent a situation where the second insulating medium has entered, been solved in or mixed with the first insulating medium. These potential problem curves provide indicators regarding faults in the bushing.

The fluid pressure in the bushing 14 may vary in relation to temperature in different ways because of various types of errors. It may for instance vary in one way if there is too much oil in the chamber of the bushing 14 and vary in another way if there is too little oil in the bushing 14. This is exemplified by the first and second potential problem curves 56 and 58. As can be seen in FIG. 4, these two potential problem curves 56 and 58, like the theoretical pressure curve 54, have the same pressure in one point, which point is here a pressure of 100 kPa at room temperature, but otherwise differ from each other and also have different slopes. The pressure variations are larger with too much oil as compared with too little oil. It is therefore possible to determine that there is too little or too much oil through detecting that the measured fluid pressure and theoretical fluid pressure are equal at room temperature, but differ at other temperatures and through investigating the rate of change in dependence of temperature, where a high rate of change indicates too much oil and a low rate of change indicates too little oil. As can be seen from the drawing these error curves 56 and 58 are furthermore non-linear. If the measured fluid pressure coincides with the theoretical fluid pressure at room temperature but differs for other temperatures and has a non-linear dependence of temperature, it is then possible to investigate the rate with which the pressure varies with temperature. If the rate of change of the measured pressure is lower than the rate of change of the second potential problem curve 58, there is too little oil and then this potential problem is indicated, while if it is higher than the rate of change of the first potential problem curve 56, there is too much oil and then that potential problem is indicated.

It is here of course also possible to compare the detected fluid pressure with corresponding computed potential problem pressures. Here the corresponding potential problem pressure for a bushing with too much oil can be determined through using equation (5) with an initial volume $V_{xi}$ set to an upper volume threshold and the corresponding potential problem pressure for a bushing with too little oil can be determined through applying equation (5) with an initial volume $V_{xi}$ set to a lower volume threshold. Here corresponding adjustments of the initial volume $V_{ci}$ are of course also made.

As can also be seen two other potential problem curves, the third curve 60 and the fifth curve 64, essentially involve a shifting of the theoretical pressure curve 54 up or down along the Y-axis. This means that these potential problems can be determined through investigating the size and sign of the difference between the measured and theoretical pressures for various temperatures when the measured fluid pressure does not coincide with the theoretical fluid pressure at room temperature. If the measured fluid pressure is larger than the theoretical fluid pressure by more than a third threshold value then gassing or overheating is determined, while if the measured fluid pressure is lower than the theoretical fluid pressure by more than a fourth threshold value, then a determination is made that an oil sample at high temperate has been taken. This means that if the oil sample has been taken via medium 34 the overpressure has been released at a high temperature. In the same way the third curve 60 may also represent an oil sample taken at a low pressure.

It can finally be seen that in case there is a leakage there are small or negligent linear changes in the pressure, see the fourth potential problem curve 62. Through seeing that the measured fluid pressure coincides with the theoretical fluid pressure at room temperature and that it changes very little and linearly with temperature an indication of a leaking bushing can therefore be generated.

In this way the diagnosing unit 26 can therefore diagnose the status of the bushing through comparing the actual pressure variation with reference pressure variation curves, step 50, and indicate a potential problem that is associated with the reference pressure variation curve that the actual pressure variation is closest to, step 52. This means that if the measured pressure variation is closer to one such potential problem curve than to the theoretical pressure curve and the other reference pressure variation curves, the potential problem associated with this curve is chosen and indicated.

It is in this way possible to diagnose the status of a bushing. This may also be done without having to open the bushing for investigating the content of the chamber. Such opening may first of all negatively influence the comparison in that properties of the insulating mediums used in the chamber may be changed, which may have a negative effect on the safety of the bushing. Also pollution and/or contaminants can enter the chamber, which may in this way negatively influence the functioning of the bushing. An opening may also lead to a re-closing not being performed properly. The bushing may become leaky. All these problems are avoided with the diagnosing of the present invention.

The diagnosing according to the principles of the present invention can furthermore be performed in a very simple way with a limited number of additional elements. Surrounding temperature sensors (like top oil and ambient temperature sensors) and current sensors are well known and widely used in relation to bushings for performing monitoring of transformers. This means that the additional elements needed are mainly a pressure sensor in a bushing as well as some additional processing power for performing the diagnosis. In this case a monitoring function, such as a bushing monitoring function, may be included as an additional function for a transformer monitoring function that is in many cases already present in relation a transformer.

From the foregoing description it is realized that the diagnosing device according to the present invention may be provided as a computer where the input unit can be realized as a network interface such as a LAN interface and the diagnosing unit may be provided in the form of a processor with an associated program memory including computer program code that performs the diagnosing function of the invention when being run by the processor. The diagnosing unit can therefore also be considered to comprise means for determining a theoretical apparatus fluid pressure based on a measured current, means for comparing the actual apparatus fluid pressure with the theoretical apparatus fluid pressure and means for diagnosing the status of an apparatus based on the comparison. Optionally it may also comprise means for determining an apparatus temperature based on the measured current together with or without surrounding temperature measurements, means for determining the theoretical apparatus fluid pressure based on a model of the change in fluid pressure in relation to apparatus temperature and means for comparing the way the actual apparatus fluid pressure varies with temperature and the way a set of reference pressure variation curves vary with temperature, where all these means may thus be realized through computer program code.

The computer program code can then also be provided on a data carrier, such as memory stick or a CD ROM disc which code performs the diagnosing according to the present invention when the carrier is loaded into a computer.

The present invention can be varied in many ways in addition to those already described. The bushing may be provided without insulation or condenser core. There may furthermore only be one insulating medium in the bushing, which may then be a gas, such as for instance SF6 or nitrogen. In this case it is the raised temperature of this medium that is the bushing temperature and also the bushing pressure used is the pressure of this medium. The model of the change in pressure that is used is then not depending on any change in volume, but only on the change in bushing temperature.

The pressure sensor may furthermore have an alternative placing in that it is placed at the top of the chamber where the gas cushion is provided. If this placing is combined with a liquid first insulating medium and a second gaseous insulating medium it is possible that the theoretical and actual bushing pressures used are only based on the pressures of the second insulating medium.

The described model of the theoretical fluid pressure can of course be changed or adapted for taking account of gassing, i.e. that some of the second gaseous insulating medium does get mixed into the liquid first insulating medium.

It is also possible to detect other potential problems than the ones described, where one such further potential problem may be a faulty electrical connection.

The pressure sensor of the bushing as well as the bushing may in some embodiments of the present invention be elements that are a part of the diagnosing device. Also one or both of the temperature sensors may be such elements. It may also be possible to determine the theoretical bushing pressure and bushing temperature without measuring ambient and transformer top oil temperatures.

Diagnosing is not limited to inductively operating pieces of high-voltage equipment, like transformers and reactors, but can be used on any piece of high-voltage equipment that is sealed and has a thermally expandable insulation medium.

The invention can furthermore be varied in that more than one bushing may be provided for a piece of equipment, like for instance three bushings, one for each phase of a power transmission system. In this case it is possible to compare the measured actual fluid pressures of these three related bushings with each other in order to determine if any pressure deviates from the others and diagnose the status of the deviating bushing based on the comparison of this pressure with a theoretical fluid pressure of the deviating bushing.

The bushing may furthermore not be directly connected to a piece of electrical equipment. It may first run through a wall and then be connected to the piece of equipment.

The electrical apparatus is in fact not limited to bushings, but may be any electrical apparatus having a sealed fluid based insulating system and can therefore for instance also be a transformer or a reactor.

The embodiments illustrated and discussed in this specification are therefore intended only to teach those skilled in the art the best way known to the inventor to make and use the invention. Nothing in this specification should be considered as limiting the scope of the present invention. All examples presented are representative and non-limiting. The above-described embodiment of the invention may be modified or varied, without departing from the invention, as appreciated by those skilled in the art in light of the above teachings. It is therefore to be understood that, within the scope of the claims and their equivalents, the invention may be practiced otherwise than as specifically described.

What is claimed is:

1. A device for diagnosing the status of an electrical apparatus having a sealed fluid based insulating system, the device comprising:
    at least one input for receiving measurements of a current running through the device and measurements of an actual apparatus fluid pressure;
    at least one surrounding temperature sensor for receiving surrounding temperature measurements, the at least one surrounding temperature sensor being connected to the at least one input;
    a transformer;
    a sealed bushing attached to the transformer, the sealed bushing including a sealed chamber comprising a first liquid insulating medium, a second gas insulating medium, an insulation, an electrical conductor, and a pressure sensor in the sealed chamber and in contact with the first liquid insulating medium; and
    a diagnosing unit, the diagnosing unit configured to perform diagnosis of the sealed bushing,
    wherein the diagnosing unit comprises:
    means for measuring current within the electrical conductor,
    means for determining a pressure of the first insulating medium based upon the current within the electrical conductor,
    means for determining a pressure of the second insulating medium based on the current within the electrical conductor,
    means for combining the pressure of the first insulating medium and the second insulating medium to determine a corresponding theoretical apparatus fluid pressure,
    means for receiving actual apparatus fluid pressure from the at least one input unit,
    means for comparing the actual apparatus fluid pressure with the theoretical apparatus fluid pressure, and
    means for diagnosing the status of the apparatus based on the comparison,
    wherein the theoretical fluid pressure is determined based on a model of the change in fluid pressure in relation to apparatus temperature.

2. The device of claim 1, further comprising a current sensor provided in the transformer, the current sensor encircling the sealed bushing.

3. The device of claim 1, wherein the transformer includes a first winding and a second winding.

4. The device of claim 1, wherein the insulation surrounds the electrical conductor in the sealed chamber.

5. The device of claim 1, wherein the diagnosing unit further comprises means for determining an apparatus temperature based on a determination of the heat generated in the apparatus by the measured current and means for determining the theoretical fluid pressure based on this apparatus temperature.

6. The device of claim 5, wherein said diagnosing unit further comprises means for determining the apparatus temperature based on the measured current and the surrounding temperature measurements.

7. The device of claim 6, wherein said at least one surrounding temperature sensor includes an ambient temperature sensor and an insulating medium temperature sensor in said transformer.

8. The device of claim 5, wherein the determined apparatus temperature is based on a determination of the heat generated in the apparatus by the current.

9. The device of claim 5, wherein the apparatus temperature is the temperature of the insulating medium.

10. The device of claim 5, wherein the diagnosing unit further comprises means for determining the theoretical fluid pressure based on a model of the change in pressure in relation to apparatus temperature.

11. The device of claim 5, wherein the diagnosing unit in relation to diagnosing the status of the apparatus further comprises means for comparing the way the actual fluid pressure varies with temperature with the way a set of reference pressure variation curves vary with temperature, where each reference pressure variation is associated with a corresponding potential problem.

12. The device according to claim 11, wherein the set of reference pressure variations include at least one variation providing an indicator in the group consisting of:
    not enough insulating medium,
    too much insulating medium,
    apparatus leakage,
    gassing or overheating
    a taken insulating medium sample, and
    faulty electrical connection.

13. A method for diagnosing the status of the device according to claim 1, the method comprising the steps of:

measuring the current running through the sealed bushing to produce measurements, the measurements being supplied by the electrical apparatus to the at least one input, determining an apparatus temperature based a determination of the heat generated in the apparatus by the measured current and sending the apparatus temperature to the at least one input;

determining a surrounding temperature and sending the surrounding temperature to the at least one input;

determining a theoretical apparatus fluid pressure based on the apparatus temperature and the surrounding temperature via software executing on the computing processor, the software executing on the computer processor comprising:

determining a pressure of the first insulating medium based upon the current within the electrical conductor, determining a pressure of the second insulating medium based upon the current within the electrical conductor, and combining the pressure of the first insulating medium and the second insulating medium to determine the theoretical apparatus fluid pressure, receiving measurements of a corresponding actual apparatus fluid pressure, comparing the actual apparatus fluid pressure with the theoretical apparatus fluid pressure via software executing on a computing processor, and diagnosing the status of the electrical apparatus based on the comparison via software executing on the computing processor, wherein the theoretical apparatus fluid pressure is determined based on a model of the change in fluid pressure in relation to the apparatus temperature.

14. The method of claim 13, wherein the surrounding temperature measurements include ambient temperature measurements and measurements of an insulating medium temperature of the piece of electrical equipment.

15. The method of claim 13, wherein the apparatus temperature is the temperature of an insulating medium in the apparatus.

16. The method of claim 13, wherein the theoretical fluid pressure is determined based on a model of the change in pressure in the apparatus in relation to apparatus temperature.

17. The method of claim 13, wherein the step of diagnosing comprises comparing the way the actual fluid pressure varies with temperature with the way a set of reference pressure variation curves vary with temperature, where each reference pressure variation curve is associated with a corresponding potential problem.

18. The method of claim 17, wherein the set of reference pressure variations include at least one variation providing an indicator in the group consisting of:

not enough insulating medium,
    too much insulating medium,
    apparatus leakage,
    gassing or overheating,
    a taken insulating medium sample, and
    faulty electrical connection.

\* \* \* \* \*